(12) United States Patent
Delattre

(10) Patent No.: US 7,439,189 B2
(45) Date of Patent: Oct. 21, 2008

(54) SURFACE TREATMENT AFTER SELECTIVE ETCHING

(75) Inventor: Cécile Delattre, Saint Hilaire du Touvet (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 354 days.

(21) Appl. No.: 11/214,591

(22) Filed: Aug. 29, 2005

(65) Prior Publication Data
US 2006/0264008 A1 Nov. 23, 2006

(30) Foreign Application Priority Data
May 19, 2005 (FR) .................................. 05 05014

(51) Int. Cl.
*H01L 21/461* (2006.01)
(52) U.S. Cl. .................. 438/752; 134/1.3; 438/974; 257/E21.485
(58) Field of Classification Search .................. 438/494, 438/498, 749, 752, 906, 974; 134/1.3
See application file for complete search history.

(56) References Cited

U.S. PATENT DOCUMENTS

| 5,665,168 | A | * | 9/1997 | Nakano et al. .................. 134/2 |
| 5,776,296 | A | * | 7/1998 | Matthews .............. 156/345.11 |
| 6,180,496 | B1 | | 1/2001 | Farrens et al. ................ 438/455 |
| 2002/0036006 | A1 | * | 3/2002 | Ueda et al. ..................... 134/33 |
| 2003/0003684 | A1 | | 1/2003 | Farrens et al. ............... 438/455 |
| 2003/0106567 | A1 | * | 6/2003 | Anabuki et al. .............. 134/1.3 |
| 2004/0053477 | A1 | | 3/2004 | Ghyselen et al. ............ 438/465 |
| 2005/0070073 | A1 | | 3/2005 | Al-Bayati et al. ........... 438/460 |

FOREIGN PATENT DOCUMENTS

| JP | 2005012076 | 1/2005 |
| WO | WO 2004/006311 | 1/2004 |

OTHER PUBLICATIONS

"Silicon-On-Insulator Technology: Materials to VLSI, 2nd Edition", by Jean-Pierre Colinge from "Kluwer Academic Publishers", pp. 50 and 51.
Drake et al., XP012035669, "Effect Of Rapid Thermal Annealing On Strain In Ultrathin Strained Silicon On Insulator Layers", Applied Physics Letters,vol. 83, No. 5, pp. 875-877 (2003).
T. Hattori, XP000860702, "Environmentally Friendly Single-Wafer Spin Cleaning", vol. 42, No. 11, pp. 73-74, 76, 78 & 80 (1999).
D. Pasquariello et al., XP004198269, "Surface Energy As A Function Of Self-Bias Voltage In Oxygen Plasma Wafer Bonding,", Sensors and Actuators, vol. 82, No. 1-3, pp. 239-244 (2000).
T. Suni et al., XP008046162,"Effects Of Plasma Activation On Hydrophilic Bonding Of Si And $SiO_2$, Journal of Electrochemical Society", vol. 149, No. 6, pp. G348-G351 (2002).

* cited by examiner

*Primary Examiner*—Walter L Lindsay, Jr.
*Assistant Examiner*—Reema Patel
(74) *Attorney, Agent, or Firm*—Winston & Strawn LLP

(57) ABSTRACT

The invention concerns a method of treating wafers comprising at least one surface layer of silicon-germanium (SiGe) and a layer of strained silicon beneath the SiGe layer. The strained silicon layer is denuded by a step of selective etching of the SiGe layer by dispensing an etching solution onto the rotating wafer. Selective etching is then followed by a step of cleaning the surface of the strained silicon layer with an aqueous ozone solution dispensed onto the rotating wafer.

17 Claims, 2 Drawing Sheets

SURFACE TREATMENT AFTER SELECTIVE ETCHING

FIELD OF THE INVENTION

The present invention relates to cleaning layers of strained silicon (sSi) denuded by selective etching of a layer of silicon-germanium (SiGe), as in the fabrication of sSOI (strained silicon on insulator) or SGOI (silicon-germanium (SiGe) on insulator) type wafers.

BACKGROUND

A number of techniques exist for preparing such wafers. One example of one of the most effective current techniques for fabricating sSOI or SGOI type wafers is the production of an active layer of strained silicon (sSi) or relaxed SiGe by transfer thereof onto an insulating support (for example a layer of $SiO_2$ on a silicon substrate) using the SMARTCUT® technique to produce the desired heterostructure. Particular examples of implementations of such fabrication techniques are described in United States patent application US 2004/053477 and International patent application WO 2004/006311.

The finishing step of such wafers involves a selective etching procedure to eliminate the SiGe layer subsisting above the silicon layer after transfer thereof to the "receiver" substrate and detachment from the "donor" substrate. Selective etching is a chemical attack method which can selectively eliminate the upper layer of SiGe without attacking the next layer of strained silicon, by adjusting the composition of the chemical solution, generally a $CH_3COOH/H_2O_2/HF$ mixture.

In a second step, a cleaning step is carried out which consists of treating the wafers with cleaning solutions.

The known standard method, termed "RCA", for cleaning the surfaces of wafers comprising a surface layer of semiconductor material comprises:

- a first step of cleaning using an SC1 (standard clean 1) solution (or APM, ammonium hydroxide peroxide mixture); containing ammonium hydroxide or ammoniacal solution ($NH_4OH$), hydrogen peroxide ($H_2O_2$), and deionized water ($H_2O$);
- a second cleaning step using an SC2 (standard clean 2) solution (or HPM, hydrochloric peroxide mixture); containing hydrochloric acid (HCl), hydrogen peroxide ($H_2O_2$) and deionized water.

The first solution, SC1, generally used at between 50° C. and 80° C., is principally intended to withdraw particles isolated on the surface of the wafer and particles buried near the surface, and to render the surface hydrophilic.

The second solution, SC2, generally used at between 70° C. and 90° C., is principally intended to remove metallic contaminants which may have been deposited on the surface of the wafer, principally by forming chlorides.

One of the disadvantages of RCA cleaning arises from using SC1 and SC2 solutions. The presence of ammoniacal solution means that a certain amount of etching cannot be avoided: the layer of strained silicon which has been released by selective etching of the SiGe layer is then etched by the RCA cleaning solution. In general, the roughness after a standard RCA clean is of the order of 1 to 2 angstroms (Å) root mean square (rms).

When producing sSOI products, the layer of strained silicon denuded by etching is the useful layer of the final product and so constraints in terms of final roughness and thickness are tight. It will thus be understood that a post selective etching cleaning step must satisfy requirements regarding effective removal of particles without being too aggressive, so as not to deteriorate the roughness and thickness of the final layer. In general, the thickness etched by the SC1 solution may be as high as 10 Å for a 200 Å strained silicon layer, knowing that RCA cleaning etches strained silicon at a rate of about 10 angstroms per minute (Å/min).

SUMMARY OF THE INVENTION

The invention aims to overcome the above-mentioned disadvantages by proposing a solution for treating the surface of a strained silicon layer after selective etching which can eliminate or reduce particulate contamination and surface defects on the surface of the strained silicon layer following selective etching of the SiGe layer, while avoiding etching of the strained silicon layer, a phenomenon which is observed with RCA cleaning.

This aim is achieved by a treatment method which comprises a step of cleaning the surface of the strained silicon layer with an aqueous ozone solution following the step of selective etching of the SiGe layer.

As is described below in more detail, the Applicant has ascertained that the number of particles and defects appearing in the strained silicon layer during the selective etching step is much smaller when it undergoes cleaning with an aqueous ozone solution rather than RCA cleaning.

Further, using a cleaning solution based on ozone instead of an SC1 or SC2 solution avoids etching the strained silicon layer and as a result, reduces the surface roughness of the layer.

In accordance with one implementation of the treatment method of the invention, the aqueous ozone solution is dispensed directly onto the rotating wafer to propagate the solution over the surface of the strained silicon layer. In this mode, the cleaning step is advantageously carried out using the chemical treatment equipment employed for the selective etching step so that the cleaning step can be concatenated with the selective etching step on the treatment equipment.

The cleaning step is carried out with a solution of ozone dissolved in deionized water in a concentration in the range 15 ppm (parts per million) to 50 ppm, at ambient temperature, for a period in the range 5 seconds (s) to 3 min, and at a wafer rotation rate in the range 400 revolutions per minute (rpm) to 2000 rpm.

In accordance with a further aspect of the invention, the method further comprises, following the cleaning step, a rinsing step using deionized water which may be carried out consecutively to the cleaning step using the wet chemical treatment equipment.

The deionized water rinsing step is carried out at ambient temperature, for a period in the range 5 s to 3 min and at a wafer rotation rate in the range 400 rpm to 2000 rpm.

The invention also provides a wafer comprising at least one surface layer of strained silicon, the surface layer having a thickness of about 200 Å, a diameter of 200 millimeters (mm) or 300 mm, a roughness of less than 1 Å rms for a scanning surface of 2 micrometers (µm) by 2 µm, a particle density of less than 3.2 particles per square centimeter (particles/$cm^2$) and a surface defect density of less than 3.2 defects/$cm^2$.

Preferably, the wafer comprises a strained silicon on insulator (sSOI) structure.

BRIEF DESCRIPTION OF THE DRAWING FIGURES

DETAILED DESCRIPTION OF PREFERRED EMBODIMENTS

The treatment method of the present invention is generally applicable to any wafer comprising at least one layer of silicon-germanium (SiGe) on a layer of strained silicon (sSi) denuded by selective etching of the SiGe layer. This treatment method may in particular be employed during fabrication of SSOI and SGOI structures using the Smart Cut® technique, which employs a step of selective etching of the SiGe layer rather than the strained silicon layer.

Figure 1A:
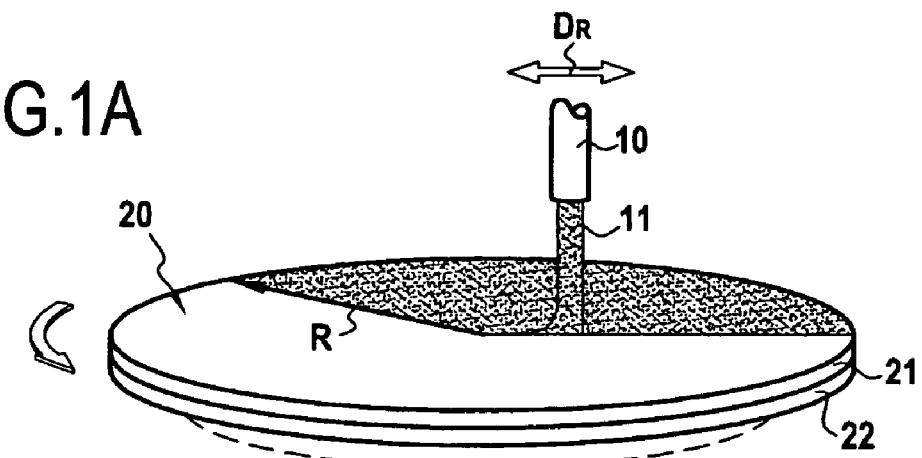
FIGS. 1A to 1C are diagrammatic perspective views respectively showing a selective etching step, a cleaning step, and a rinsing step in accordance with one implementation of the invention.

FIG. 1A very diagrammatically shows one implementation of the etching step applied to selective etching of a layer of SiGe rather than a layer of strained silicon. In this step, "single wafer" type wet chemical treatment equipment is employed, wherein selective etching is carried out by dispensing an etching solution 11 directly onto a single wafer 20 comprising a surface layer 21 of SiGe over a layer of strained silicon 22, the solution being dispensed via a nozzle 10 onto the wafer 20 which is rotated. The nozzle 10 is connected to a mechanism (not shown) which can displace the nozzle above the wafer 20 in a radial direction $D_R$. The etching solution 11 is, for example, constituted by a known mixture of acetic acid ($CH_3COOH$), hydrogen peroxide ($H_2O_2$) and hydrofluoric acid (HF). A preferred method of etching method is described in U.S. patent application Ser. No. 11/356,927 filed Feb. 16, 2006, now U.S. Pat. No. 7,396,483.

Once the SiGe layer has been etched, the surface of the strained silicon layer which has been denuded must be cleaned to reduce the number of particles and surface defects arising from the chemical etching step.

In accordance with the invention, this cleaning step is carried out using an aqueous ozone solution. As is shown below, cleaning with an aqueous ozone solution gives better results as regards the removal of particles and surface defects than with the cleaning solutions normally used, such as SC1 and SC2 solutions. The principal residues present on the surface of the silicon layer are those from the acetic acid used during the selective etching step. The residues are removed during the cleaning step of the invention by the oxidizing action of ozone on acetic acid in accordance with the equation:

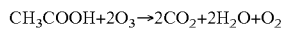

$$CH_3COOH + 2O_3 \rightarrow 2CO_2 + 2H_2O + O_2$$

That type of cleaning is normally implemented on machines that can carry out batch cleaning, i.e. several wafers at a time. The wafers are immersed in the same cleaning solution: this is known as "wet bench" type equipment.

Figure 1B:
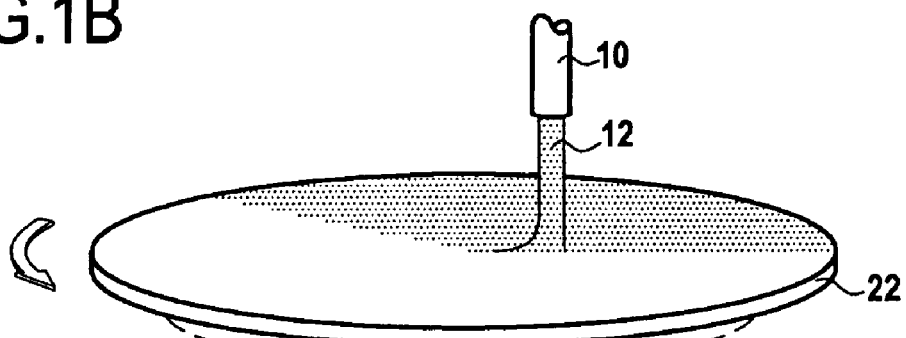

However, cleaning may also be carried out using single wafer type equipment as described above for the selective etching step. In this case, as shown in FIG. 1B, cleaning is carried out one wafer at a time, with an aqueous ozone solution 12 being dispensed via the nozzle 10 directly over the rotating strained silicon layer 22 to propagate the solution over the wafer surface. This implementation (i.e. cleaning using single wafer equipment) means that the cleaning step and the selective etching step may be carried out on the same equipment. In fact, immediately after the acetic acid treatment during selective etching, the wafers are cleaned with the aqueous ozone solution. The wafers thus do not need to be manipulated between the selective etching step and the cleaning step; only the nature of the solution dispensed via the nozzle 10 changes (etching solution then cleaning solution).

Further, regarding particulate removal efficiency, it transpires that the results obtained with the cleaning step of the invention (i.e. with the aqueous ozone solution) are substantially better compared with RCA cleaning when the cleaning step is carried out using single wafer type equipment rather than with wet bench type equipment.

Figure 2:
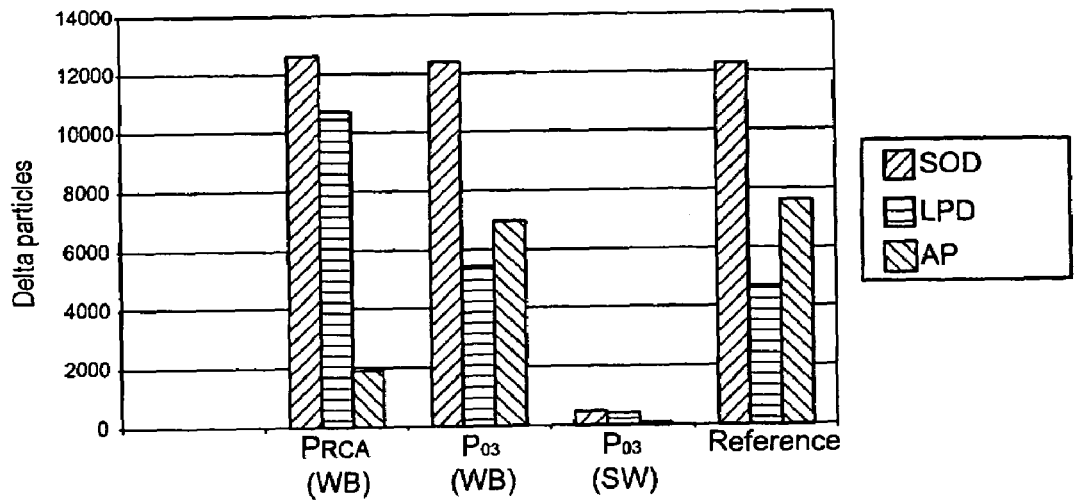
FIG. 2 is a histogram showing the number of particles and surface defects in layers of strained silicon after selective etching and as a function of the type of cleaning applied.

FIG. 2 shows measurements of the number of particles (LPD, light point defects) and agglomerates of particles (AP) producing the number of surface defects (SOD, sum of defects) for 200 mm diameter wafers which had respectively undergone:

- selective etching of the SiGe layer and RCA cleaning in wet bench type equipment ($P_{RCA}(WB)$);
- selective etching of the SiGe layer and cleaning with an aqueous ozone solution in wet bench equipment ($P_{O3}(WB)$);
- selective etching of the SiGe layer and cleaning with an aqueous ozone solution in single wafer type equipment ($P_{O3}(SW)$); and
- selective etching alone of the SiGe layer with no subsequent cleaning (reference).

Thus, considering the number of particles (columns LPD in FIG. 2, which represent the number of particles detected per optical measurement using a light point defects inspection or localized light scatterer laser) before and after cleaning and the total number of surface defects (columns SOD in FIG. 2, corresponding to the sum of LPD and AP defects/particles), it can be seen that cleaning with an aqueous ozone solution in wet bench type equipment ($P_{O3}(WB)$) provides a slight improvement (primarily in LPD) over RCA cleaning ($P_{RCA}(WB)$), while it becomes highly effective when it is carried out using single wafer type equipment ($P_{O3}(SW)$). As indicated in FIG. 2, after a cleaning step with an aqueous ozone solution dispensed by single wafer type equipment, very few particles (<1000, i.e. a density of <3.2 particles/$cm^2$ for a 200 mm diameter wafer) and surface defects (<1000, i.e. a density of <3.2 defects/$cm^2$ for a 200 mm diameter wafer) remain in the strained silicon layer.

Figure 3:
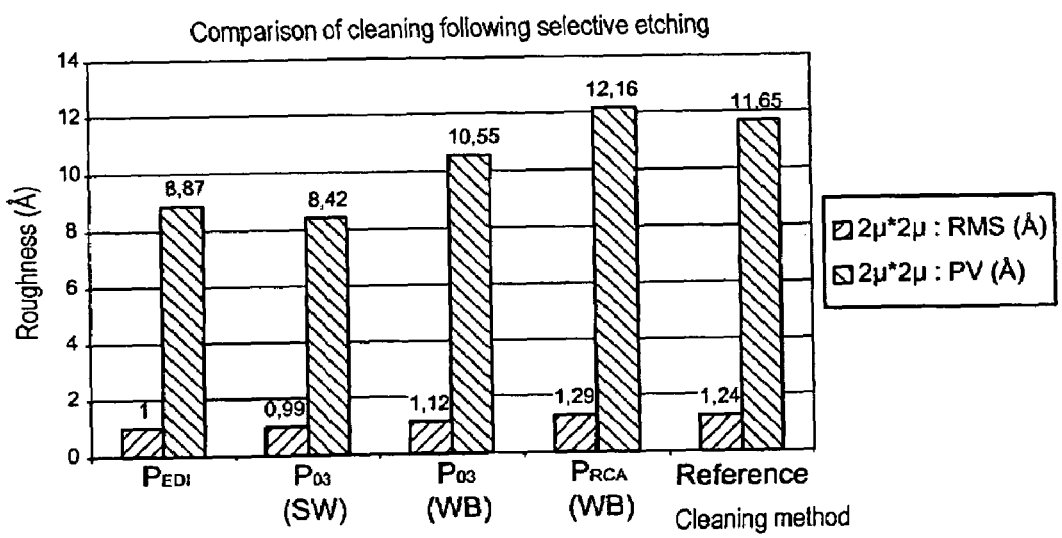
FIG. 3 is a histogram showing the surface roughness of strained silicon layers obtained as a function of the type of cleaning applied.

Further, the surface roughness of the strained silicon layer was studied for the different types of cleaning. FIG. 3 shows the surface roughness of a strained silicon layer for 200 mm diameter wafers, where "2µ*2µ:RMS(Å)" means the root mean square roughness measured in Å over a scanning surface of 2 µm*2 µm and "2µ*2µ:PV(Å)" means the peak roughness value similarly measured. The wafers have respectively undergone:

- selective etching of the SiGe layer and rinsing with water ($P_{EDI}$);
- selective etching of the SiGe layer and cleaning with an aqueous ozone solution in single wafer type equipment ($P_{O3}(SW)$);
- selective etching of the SiGe layer and cleaning with an aqueous ozone solution in wet bench type equipment ($P_{O3}(WB)$);
- selective etching of the SiGe layer and RCA cleaning in wet bench type equipment ($P_{RCA}(WB)$); and selective etching alone of the SiGe layer with no subsequent cleaning (reference).

The results of FIG. 3 show that the surface roughness is lower after cleaning with the aqueous ozone solution compared with RCA cleaning, which makes sense because of the composition of SC1 and SC2 solutions. Further, when cleaning with the aqueous ozone solution, the surface roughness is lower when the cleaning is carried out with single wafer equipment rather than with wet bench type equipment.

Figure 1C:
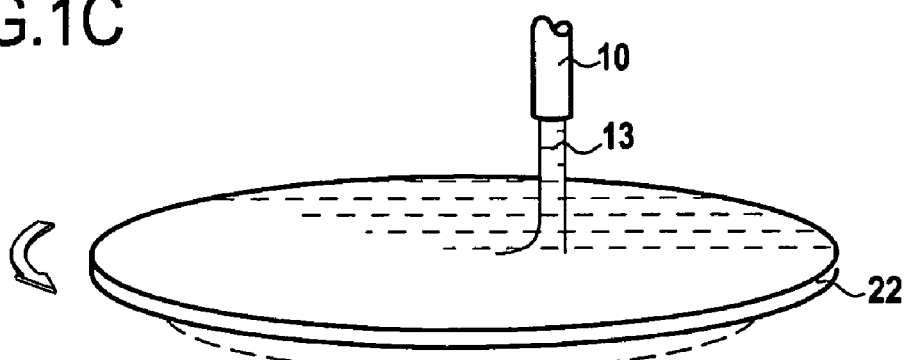

Further still, the cleaning step using the aqueous ozone solution of the invention may be followed by a step of rinsing with deionized water (DIW). As shown in FIG. 1C, the rinsing step may be carried out with single wafer type equipment wherein the nozzle 10 is used to dispense deionized water 13 over the rotating strained silicon layer 22.

Thus, by using single wafer type equipment, the steps of selective etching, cleaning with an aqueous ozone solution and rinsing with deionized water may be performed continuously one after the other, reducing the treatment time for each wafer and minimizing manipulation.

The step of selective etching of the SiGe layer as regards a strained silicon layer may be carried out under the following conditions:

selective etching solution: $CH_3COOH/H_2O_2/HF$;
etching temperature: preferably 25° C., but may be between 20° C. and 60° C.;
etching period: 20 seconds to 300 seconds;
wafer rotation rate: about 1000 rpm, but may be between 400 rpm and 2000 rpm.

The cleaning step may be carried out under the following conditions:

$O_3$ dissolved in deionized water in a concentration of 15 ppm to 50 ppm;
temperature: preferably, ambient temperature (assumed to be 20° C.±5° C.), but may be between 20° C. and 30° C.;
treatment period: preferably 20 s, but may be between 5 s and 3 min;
wafer rotation rate: preferably 800 rpm, but may be between 400 rpm and 2000 rpm.

The optional deionized water rinsing step may be carried out under the following conditions:

temperature: preferably ambient temperature ((assumed to be 20° C.±5° C.), but may be between 20° C. and 30° C.;
treatment period: preferably 10 s, but may be between 5 s and 3 min;
wafer rotation rate: preferably 1000 rpm, but may be between 400 rpm and 2000 rpm.

The cleaning period in a post selective etching treatment, comprising a step of cleaning with aqueous ozone solution and a step of rinsing with deionized water, is about 30 seconds per wafer when carried out on single wafer equipment or 250 seconds per batch when carried out on wet bench equipment, while for post selective etching treatment comprising RCA cleaning, which is carried out on wet bench equipment, the period is 1500 seconds per batch.

The post selective etching treatment of the invention also enjoys a substantial advantage in terms of the treatment period compared with RCA cleaning, both when using single wafer and when using wet bench equipment.

For the purposes of simplification in the present description, the treatment method of the invention and the results obtained therewith have been described with respect to a 200 mm diameter wafer. However, the skilled person will readily envisage carrying out the method of the invention and obtaining equivalent results for wafers with different diameters, in particular wafers with a diameter of 300 mm.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

A number of references are cited herein, the entire disclosures of which are incorporated herein, in their entirety, by reference for all purposes. Further, none of these references, regardless of how characterized above, is admitted as prior to the invention of the subject matter claimed herein.

What is claimed is:

1. A method of treating a wafer comprising at least one surface layer of silicon-germanium (SiGe) and a layer of strained silicon beneath the SiGe layer, the method comprising:
   selectively etching of the SiGe layer with an etching solution comprising a mixture of acetic acid ($CH_3COOH$), hydrogen peroxide ($H_2O_2$) and hydrofluoric acid (HF); and at a temperature in the range 20° C. to 60° C.; and for a time period in the range of 20 s to 300 s in order to denude the strained silicon layer; and
   cleaning the surface of the strained silicon layer with an aqueous cleaning solution consisting essentially of ozone as the cleaning agent in the aqueous solution.

2. The method of claim 1, which further comprises rotating the wafer while to aqueous ozone solution is dispensed directly onto the rotating wafer so that the solution is propagated over the entire surface of the strained silicon layer.

3. The method of claim 1, wherein the selective etching step is carried out while the wafer is rotating at a rate in the range 400 rpm to 2000 rpm.

4. The method of claim 1, wherein the cleaning step is carried out with a solution of ozone dissolved in deionized water in a concentration in the range 15 ppm to 50 ppm; and at ambient temperature; and over a period in the range 5 s to 3 mm; and while the wafer is rotating at a rate in the range 400 rpm to 2000 rpm.

5. The method of claim 1, further comprising rinsing the wafer with deionized water after the cleaning step.

6. The method of claim 5, wherein the deionized water rinsing step is carried out at ambient temperature; and for a period in the range 5 s to 3 mm; and while the wafer is rotating at a rate in the range 400 rpm to 2000 rpm.

7. The method of claim 6, wherein the cleaning step is carried out for about 20 seconds, and wherein the deionized water rinsing step is carried out for a period of about 10 s.

8. The method of claim 1, wherein the strained silicon layer has a thickness of about 200 Å, a roughness of less than 1 Å rms for a scanning surface of 2 μm*2 μm, a particle density of less than 3.2 particles/$cm^2$ and a surface defect density of less than 3.2 defects/$cm^2$.

9. The method of claim 8, wherein the wafer has a diameter of 200 mm.

10. The method of claim 8, wherein the wafer has a diameter of 300 mm.

11. The method of claim 8, wherein the wafer after etching is in the form of a strained silicon on insulator (sSOI) structure.

12. A method of treating a wafer comprising at least one surface layer of silicon-germanium (SiGe) and a layer of strained silicon beneath the SiGe layer, the method comprising:

selectively etching of the SiGe layer in order to denude the strained silicon layer, and cleaning the surface of the strained silicon layer with an aqueous cleaning solution consisting essentially of ozone as the cleaning agent in the aqueous solution, wherein both the selective etching step and the cleaning step are carried out with a wet chemical treatment equipment, and wherein the cleaning step is carried out consecutively to the selective etching step on the same equipment.

13. A method of treating a wafer comprising at least one surface layer of silicon-germanium (SiGe) and a layer of strained silicon beneath the SiGe layer, the method comprising:

selectively etching of the SiGe layer in order to denude the strained silicon layer, and cleaning the surface of the strained silicon layer with an aqueous cleaning solution consisting essentially of ozone as the cleaning agent in the aqueous solution, wherein the selective etching and cleaning are conducted sequentially on the wafer in the same wet chemical treatment equipment comprising:

a support for rotating a wafer;

a nozzle for dispensing an etching solution onto a rotating wafer; and a controller for controlling the support to rotate the wafer and the nozzle to dispense onto the wafer in consecutive order an etching solution for the selective etching followed by the aqueous ozone containing cleaning solution.

14. The method of claim 13, wherein the etching comprises a mixture of acetic acid ($CH_3COOH$), hydrogen peroxide ($H_2O_2$) and hydrofluoric acid (HF) and at a temperature in the range 20° C. to 60° C.; and wherein the etching solution is dispensed for a period in the range 20 s to 300 s with the wafer is rotating at a rate in the range 400 rpm to 2000 rpm.

15. The method of claim 13, wherein the aqueous ozone solution comprises ozone dissolved in deionized water in a concentration in the range 15 ppm to 50 ppm and at ambient temperature; and wherein the aqueous ozone solution is dispensed for a period in the range 5 s to 3 mm with the wafer rotating at a rate in the range 400 rpm to 2000 rpm.

16. The method of claim 13, wherein the controller further controls the nozzle to dispense onto the wafer deionized water in consecutive order with the aqueous ozone cleaning solution.

17. The method of claim 16, wherein the deionized water rinsing step is carried out at ambient temperature; and wherein the deionized water is dispensed for a period in the range 5 s to 3 mm and with the wafer rotating at a rate in the range 400 rpm to 2000 rpm.

* * * * *

UNITED STATES PATENT AND TRADEMARK OFFICE
CERTIFICATE OF CORRECTION

PATENT NO. : 7,439,189 B2  Page 1 of 1
APPLICATION NO. : 11/214591
DATED : October 21, 2008
INVENTOR(S) : Delattre It is certified that error appears in the above-identified patent and that said Letters Patent is hereby corrected as shown below:

<u>Column 6</u>:
Line 41 (claim 4, line 5), after "3", change "mm" to -- min --.
Line 47 (claim 6, line 3), after "3", change "mm" to -- min --.

<u>Column 8</u>:
Line 14 (claim 15, line 5), after "3", change "mm" to -- min --.
Line 23 (claim 17, line 4), after "3", change "mm" to -- min --.

Signed and Sealed this

Second Day of December, 2008

JON W. DUDAS
*Director of the United States Patent and Trademark Office*